United States Patent [19]

Takemoto et al.

[11] Patent Number: 5,862,088
[45] Date of Patent: Jan. 19, 1999

[54] APPARATUS AND METHOD FOR TESTING A MEMORY

[75] Inventors: Hiroshi Takemoto, Hachiouji; Eiichi Sekine, Yokohoma, both of Japan

[73] Assignee: Advantest Corporation, Tokyo, Japan

[21] Appl. No.: 60,400

[22] Filed: Apr. 14, 1998

[30] Foreign Application Priority Data

Apr. 14, 1997 [JP] Japan ................................ 9-095679

[51] Int. Cl.$^6$ .................................................. Q11C 13/00
[52] U.S. Cl. ...................... 365/201; 365/189.01
[58] Field of Search ............................. 365/201, 189.01

[56] References Cited

U.S. PATENT DOCUMENTS 5,691,945 11/1997 Liou et al. .............................. 365/200

*Primary Examiner*—Terrell W. Fears
*Attorney, Agent, or Firm*—Gallagher & Lathrop; David N. Lathrop

[57] ABSTRACT

In a memory testing apparatus wherein a plurality of function tests are continuously carried out for a semiconductor memory and a decision as to whether or not a failure relieving analysis of the memory should be performed is rendered upon completion of each function test, a failure cell counter 15 is provided at the rear stage of a failure analysis memory 13. When a failure memory cell is detected in a memory under test MUT in each function test, the number of failure cells of the memory under test is counted by the failure cell counter. A main controller controls operations of the memory testing apparatus ST such that a failure relieving analysis of the memory under test is performed only when the number of failure memory cells detected in the function test performed this time is greater than the number of failure memory cells detected in the preceding function test.

6 Claims, 5 Drawing Sheets

MEMORY TESTING APPARATUS

APPARATUS AND METHOD FOR TESTING A MEMORY

BACKGROUND OF THE INVENTION

1. Field of the Invention

The present invention relates to a memory testing apparatus and a memory testing method for testing a memory (IC memory) in the form of a semiconductor integrated circuit (IC), and more particularly, to an analysis for relieving a failure of a semiconductor memory.

2. Description of the Related Art

FIG. 4 shows a basic construction of a conventional memory testing apparatus of this type. The illustrated memory testing apparatus TS comprises a pattern generator 10, a waveform producing device 11, a logical comparator 12, a failure analysis memory 13, and a mask memory 14, and also includes a main controller CP for controlling operations of the memory testing apparatus TS. This main controller CP comprises a computer, and the pattern generator 10 and the logical comparator 12 are also connected to the main controller CP.

The pattern generator 10 generates, under control of the main controller PC, an address signal and a test pattern data signal to supply them to the waveform producing device 11. The waveform producing device 11 produces, based on the signals supplied thereto, an address signal and a test pattern signal having waveforms required for testing a semiconductor memory to be tested (hereinafter referred to as memory under test) MUT and applies those signals to the memory under test MUT to write the test pattern signal in each address of the memory under test MUT.

The test pattern signal written in the memory under test MUT is read out therefrom later and is supplied to the logical comparator 12 where it is compared with an expected value data signal (EXP) supplied to the logical comparator 12 from the pattern generator 10 under control of the main controller CP. If there is an anticoincidence or mismatch between both signals, the logical comparator 12 outputs a failure signal to the failure analysis memory 13, and the failure signal (failure data) is stored at an address of the failure analysis memory 13 which is specified by an address signal (not shown) supplied to the failure analysis memory 13 from the pattern generator 10. At the same time, the logical comparator 12 informs the main controller CP of the occurrence of a failure memory cell. Usually, since an address signal supplied to the memory under test MUT when the written data is read out thereof is also supplied to the failure analysis memory 13, the failure data is stored at the same address of the failure analysis memory 13 as that of the memory under test MUT.

In such a way, failure data indicating positions of failure memory cells of the memory under test MUT having occurred during one test cycle are stored in the failure analysis memory 13.

Usually, the memory testing apparatus TS is arranged to carry out function tests of a plurality of items for a memory under test MUT by changing, for example, the amplitude value of a test pattern signal, or the operation voltage applied to the memory under test MUT, thereby to detect failure memory cells of that memory. In this case, failure cell information generated in each function test is stored in the failure analysis memory 13, and with reference to the stored data, an analysis of relieving a failure (hereinafter referred to as failure relieving analysis) of the memory under test is carried out, that is, a decision for determining whether it is possible to relieve the memory under test or not possible is rendered.

A predetermined length of time is required for performing a failure relieving analysis of a memory. If a failure relieving analysis is performed for each function test, a considerably long time is required in total. Therefore, the failure relieving analysis must be performed at the required minimum.

Consequently, as shown in FIG. 4, in the prior art memory testing apparatus, a mask memory 14 is provided in addition to the failure analysis memory 13. Information of failure memory cells which have been determined as failure memory cells in the previous function test is stored in this mask memory 14. In the next function test, a mask data (MASK) for inhibiting the logical comparator 12 from performing a logical comparison operation on the same memory cell position as the failure memory cell position which is already stored in the mask memory 14 is supplied to the logical comparator 12. In the case in which the logical comparator 12 does not detect a new failure memory cell due to this masking of the failure memory cell positions, the logical comparator 12 does not inform the main controller CP of an occurrence of a failure memory cell. Thus, the main controller CP determines "there is no failure memory cell detected" and controls the operation of the memory testing apparatus TS such that the failure relieving analysis of the memory is omitted and the control operation jumps to the next function test.

The control operation of the main controller CP will be further explained with reference to a flow chart shown in FIG. 5.

FIG. 5 exemplarily shows three consecutive function test routines consisting of a first function test routine LU1, a second function test routine LU2 and a third function test routine LU3, and storage states of failure memory cell information in the failure analysis memory 13 and the mask memory 14 in each of the function test routines LU1–LU3.

First, at the starting time (START) of a first function test of the first function test routine LU1, the storage contents of the failure analysis memory 13 and the mask memory 14 are cleared, and all the stored data are erased.

Next, the first function test of step SP1 is immediately performed. When a failure signal indicating a discordance is outputted from the logical comparator 12 during this function test, a failure data of, for example, logical "1" indicating a failure memory cell is stored in an address of the failure analysis memory 13 which is the same address of the memory under test MUT where the failure memory cell exists. In the example of FIG. 5, there is shown a case in which failures occurred in three memory cells of a memory under test.

Even if a failure occurs in only one memory cell of the memory under test during the first function test in step SP1, the logical comparator 12 informs the main controller CP of the failure occurrence. Thus, the main controller CP recognizes that a failure memory cell is detected during the first function test. Since the main controller CP recognizes that a failure memory cell has been detected in the first function test routine LU1, a failure of the memory cell is determined based on the recognition data in step SP2 for determining pass/failure of a memory cell and then a memory failure relieving analysis of step SP3 is performed.

In step SP3 for a memory failure relieving analysis, the number of failure memory cells stored in the failure analysis memory 13 is counted and a determination is made to see if the failure memory cells counted can be replaced by alternate memory cells. If the replacement is possible, the control operation proceeds to the second function test routine LU2.

In the second function test routine LU2, the stored data in the failure analysis memory 13 are transferred first to the mask memory 14 before performing the second function test of step SP4 and the position information of the failure memory cells detected in the first function test is copied to the mask memory 14.

When the second function test of step SP4 is performed, the storage contents of the mask memory 14 are supplied to the logical comparator 12 as mask data and the logical comparator 12 is inhibited from performing logical comparison operations on the same memory cell positions as the failure memory cell positions (three memory cells in the illustrated example) the information of which is already stored in the mask memory 14. Therefore, if there is no failure detected during the second function test of step SP4 in the memory cells other than the failure memory cells detected in the former test, the logical comparator 12 does not detect any failure memory cell. Consequently, the main controller CP concludes that there is "no memory cell determined to be a failure memory cell" in the second function test. As a result, since the number of failure memory cells is equal to the result of the first function test, the pass/failure determination process performed in step SP5 determines that the memory under test is pass. Then the control operation proceeds to the next third function test routine LU3 without performing step SP6 for memory failure relieving analysis.

In the third function test routine LU3 illustrated in FIG. 5, there is shown a case in which two failure memory cells are newly detected in the memory under test during the third function test of step SP7. Since the main controller CP recognizes the occurrence of failure memory cells based on the detection of the new failure memory cells, the memory under test is determined to be a failure memory in step SP8 after the third function test of step SP7 is completed, and then step SP9 for memory failure relieving analysis is performed.

As mentioned above, in the prior art memory testing apparatus, information of memory cells determined to be failure memory cells in the function tests performed in the past is stored in the mask memory 14. This information of the failure memory cell positions stored in the mask memory 14 is supplied to the logical comparator 12 so that the comparison operations of the logical comparator 12 on those memory cells are masked (inhibited). As a result, since the logical comparison operations are not performed for the positions of the memory cells determined to be failure memory cells in the past, no failure signal is generated even if, in the subsequent function tests, a failure memory cell exists at the same position as that of the memory cell determined to be a failure memory cell in the past. That is, since a failure relieving analysis is performed only when new failure memory cells are detected, the number of times that failure relieving analysis operations are performed can be reduced and the test time of a memory under test can be reduced.

However, there is a drawback in the construction of the conventional memory testing apparatus that a mask memory 14 is required in addition to a failure analysis memory 13. That is, the failure analysis memory 13 has a large storage capacity and the mask memory 14 requires the same storage capacity as that of the failure analysis memory 13. Therefore, an extra memory having a large storage capacity must be added and hence there is a drawback that the manufacturing cost of the memory testing apparatus becomes considerably high.

SUMMARY OF THE INVENTION

It is an object of the present invention to provide a memory testing apparatus which can determine, without providing a mask memory, whether or not a failure relieving analysis of a semiconductor memory should be performed upon completion of each of a plurality of function tests.

It is another object of the present invention to provide a method for testing a memory which can determine, through comparisons among the plurality of numbers of failure memory cells of a memory under test detected in respective plurality of function tests, whether or not a failure relieving analysis of a semiconductor memory should be performed upon completion of each function test.

In order to achieve the objects described above, in one aspect of the present invention, there is provided a memory testing apparatus wherein a plurality of function tests are continuously carried out for a semiconductor memory to be tested, information of a failure memory cell or cells detected in the semiconductor memory is stored in a failure analysis memory upon completion of each function test, and a decision as to whether or not the semiconductor memory can be relieved is rendered depending upon the number of failure memory cells stored in the failure analysis memory, the memory testing apparatus being constructed such that after one of the function tests is performed, the number of failure memory cells of a memory under test detected in the preceding function test is compared with the number of failure memory cells of the memory under test detected in a function test performed this time, and a failure relieving analysis of the memory under test is performed only when the number of failure memory cells detected this time is greater than the number of failure memory cells detected in the preceding function test.

The memory testing apparatus preferably includes at least a pattern generator, a waveform producing device, a logical comparator, a failure analysis memory and a main controller for controlling operations of the memory testing apparatus.

The pattern generator generates, under control of the main controller, a test pattern data signal and supplies the test pattern data signal to the waveform producing device; the waveform producing device generates, based on a signal supplied thereto from the pattern generator, a test pattern signal having a waveform required for a semiconductor memory test and applies the test pattern signal to the semiconductor memory; the logical comparator compares a signal read out from the semiconductor memory with an expected value data signal supplied to the logical comparator from the pattern generator under control of the main controller, and judges, when there is a discordance between both signals, that the semiconductor memory has a failure memory cell and supplies a failure signal indicating a failure of a memory cell to the failure analysis memory, and at the same time, informs the main controller of an occurrence of a failure memory cell; and the failure analysis memory stores therein the failure signal indicating a failure of a memory cell or a failure data corresponding to the failure signal, and at the same time, supplies the number of failure data stored therein to the main controller.

In a preferred embodiment, the memory testing apparatus includes a pattern generator, a waveform producing device, a logical comparator, a failure analysis memory, a failure cell counter and a main controller for controlling operations of the memory testing apparatus; the pattern generator, the logical comparator and the failure cell counter are also connected to the main controller; the pattern generator generates, under control of the main controller, a test pattern data signal and supplies the test pattern data signal to the waveform producing device; the waveform producing device generates, based on a signal supplied thereto from the pattern generator, a test pattern signal having a waveform required for a semiconductor memory test and applies the test pattern signal to the semiconductor memory; the logical comparator compares a signal read out from the semiconductor memory with an expected value data signal supplied to the logical comparator from the pattern generator under control of the main controller, and judges, when there is a discordance between both signals, that the semiconductor memory has a failure memory cell and supplies a failure signal indicating a failure of a memory cell to the failure analysis memory, and at the same time, informs the main controller of an occurrence of a failure memory cell; the failure analysis memory stores therein the failure signal indicating a failure of a memory cell or a failure data corresponding to the failure signal; and the failure cell counter counts the number of failure data stored in the failure analysis memory and supplies the number of failure data to the main controller.

Further, the main controller controls, in each of the function tests, the memory testing apparatus such that: when no failure memory cell is detected in the semiconductor memory to be tested, a control operation is immediately advanced to a next function test; when one or more failure memory cells are detected in the semiconductor memory to be tested, the number of failure memory cells stored in the failure analysis memory is counted after a current function test is completed; and in each of subsequent function test routines except for the first function test routine, the count value of the failure memory cells is compared with the count value of the failure memory cells counted after completion of the previous function test, when the count value counted this time is equal to or smaller than the previous count value, the control operation is advanced to a next function test routine, and when the count value counted this time is greater than the previous count value, the control operation is advanced to a next function test routine after performing a failure relieving analysis of the semiconductor memory to be tested.

In another aspect of the present invention, in a memory testing apparatus wherein a plurality of function tests are continuously carried out for a semiconductor memory to be tested, information of a failure memory cell or cells detected in the semiconductor memory is stored in a failure analysis memory upon completion of each function test, and a decision as to whether or not the semiconductor memory can be relieved is rendered depending upon the number of failure memory cells stored in the failure analysis memory, there is provided a method for testing a memory comprising the steps of: comparing, after one of the function tests is performed, the number of failure memory cells of a memory under test detected in a previous function test with the number of failure memory cells of the memory under test detected in a function test performed this time; and performing a failure relieving analysis of the memory under test only when the number of failure memory cells detected this time is greater than the number of failure memory cells detected previous time.

In a preferred embodiment, the method for testing a memory further comprises the steps of: immediately advancing a control operation to a next function test routine when no failure memory cell is detected in the semiconductor memory to be tested in each of the function tests; counting the number of failure memory cells stored in the failure analysis memory after a current function test is completed when one or more failure memory cells are detected in the semiconductor memory to be tested; the comparing step is a step wherein in each of subsequent function test routines except for the first function test routine, the number of failure memory cells detected this time is compared with the number of failure memory cells detected previous time, when the number of failure memory cells detected this time is equal to or smaller than the number of failure memory cells detected previous time, the control operation is advanced to a next function test routine, and when the number of failure memory cells detected this time is greater than the number of failure memory cells detected the previous time, the control operation is advanced to a step for performing a failure relieving analysis of the semiconductor memory to be tested.

According to the apparatus and the method for testing a memory in the present invention, if the number of failure memory cells detected in the function test carried out this time is equal to the number of memory cells determined as failure memory cells in the function tests performed in the past, it is determined that there is no new failure memory cell in the memory under test. Hence a memory failure relieving analysis is not performed. Further, if the number of failure memory cells detected in the function test carried out this time is greater than the number of memory cells determined as failure memory cells in the function tests performed in the past, it is determined that one or more new failure memory cells exist in the memory under test. Hence a memory relief analysis is performed. Thus, the determination as to whether or not the failure relieving analysis should be performed can be made even if the mask memory is not provided.

DETAILED DESCRIPTION OF THE PREFERRED EMBODIMENTS

Now, an embodiment of the memory testing apparatus according to the present invention will be described in detail with reference to FIGS. 1 to 3.

Figure 1:
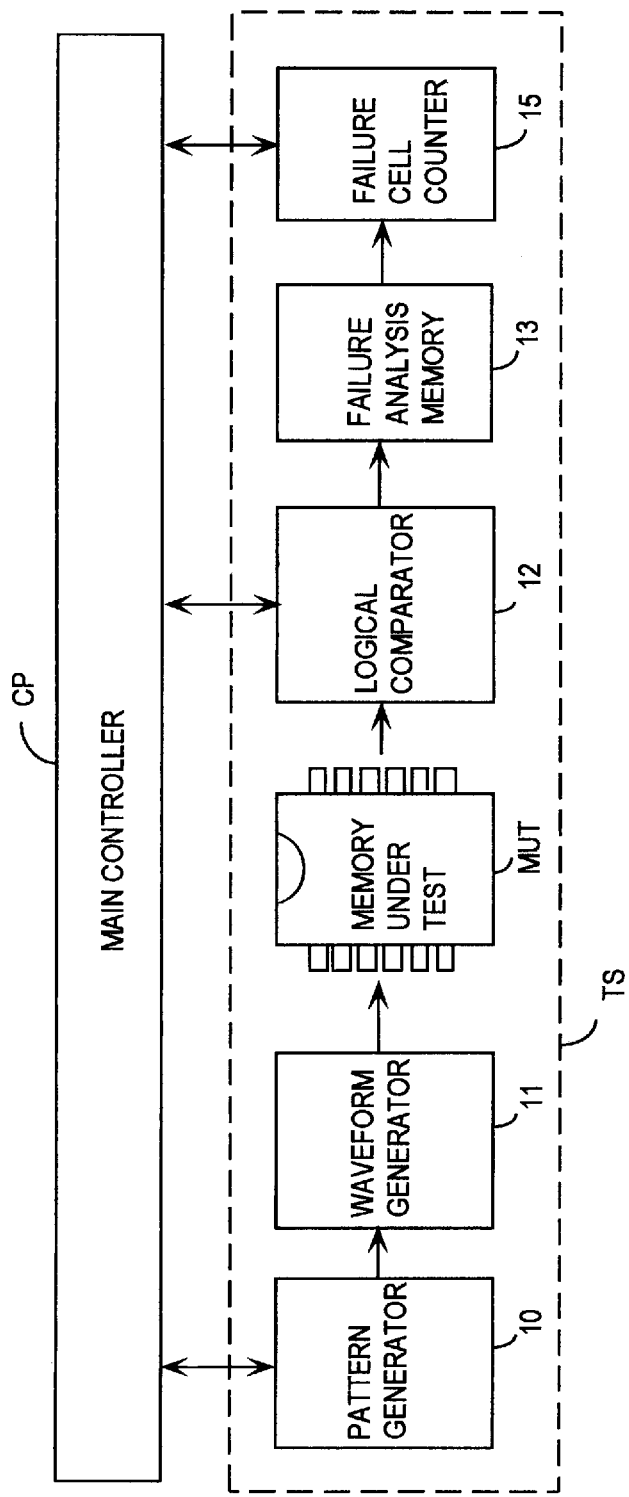
FIG. 1 is a block diagram showing, together with a main controller, a basic construction of an embodiment of the memory testing apparatus according to the present invention.
Figure 4:
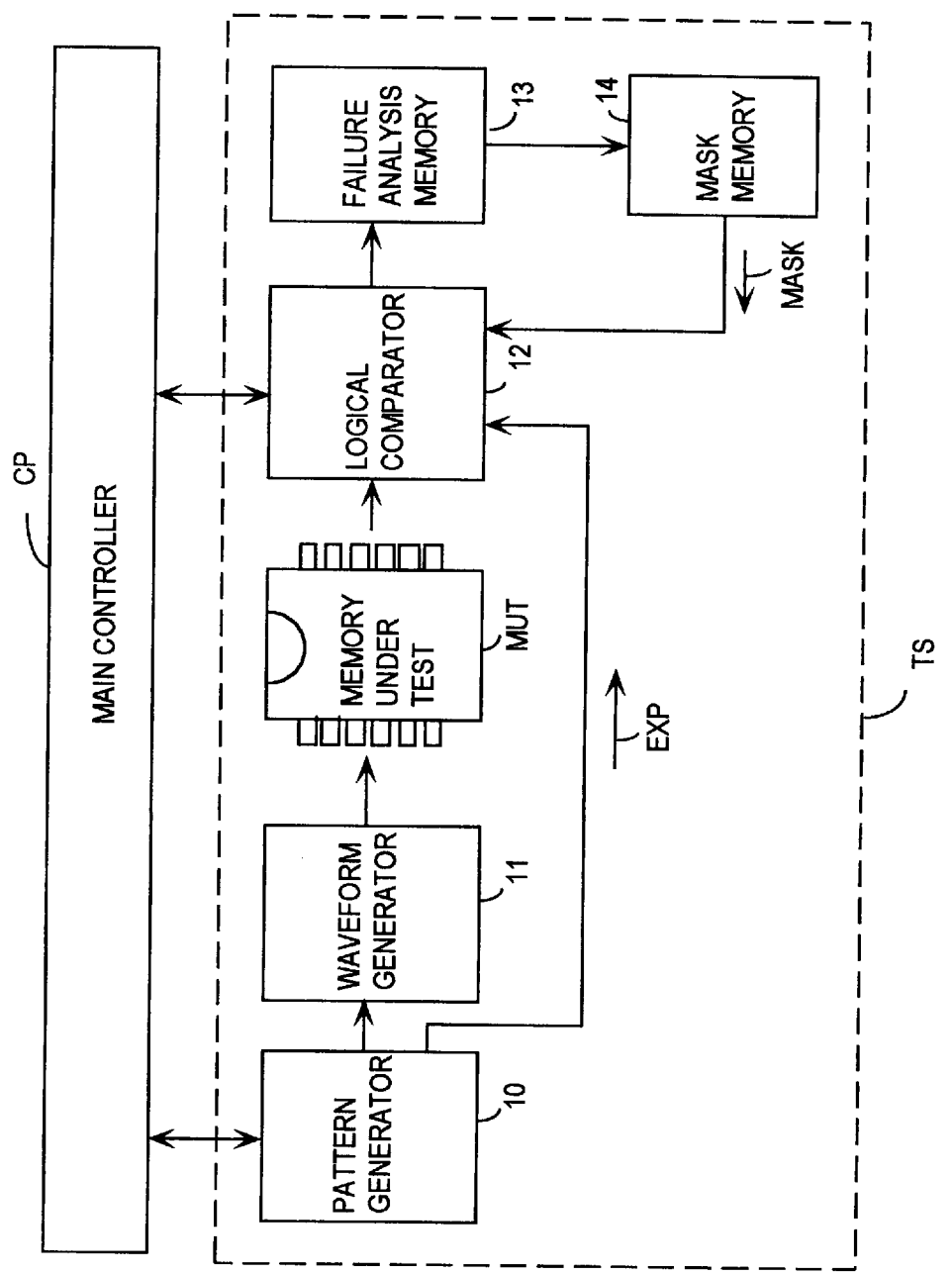
FIG. 4 is a block diagram showing, together with the main controller, a basic construction of an example of the conventional memory testing apparatus.
Figure 5:
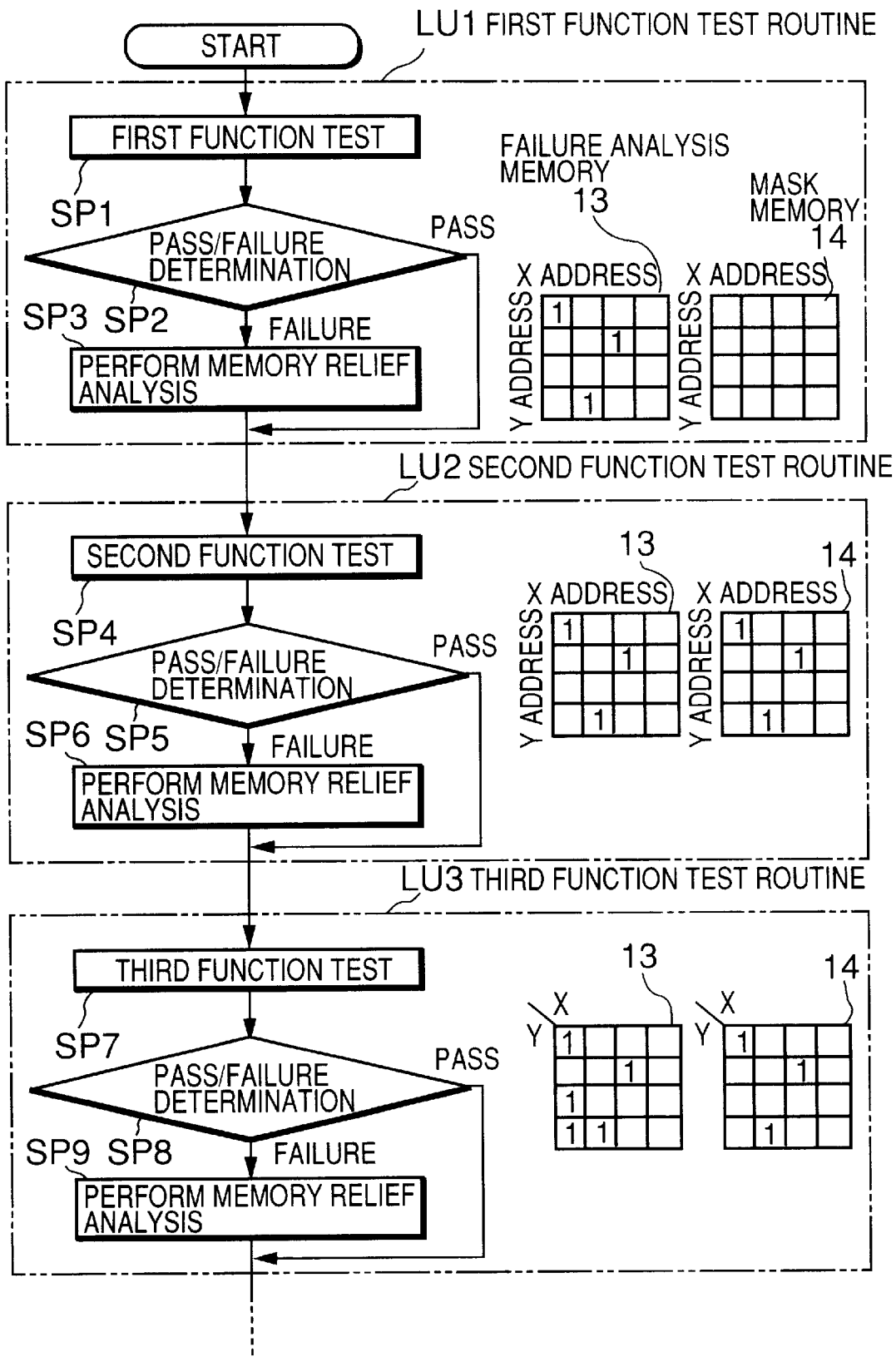
FIG. 5 is a flow chart for explaining the operations of the memory testing apparatus shown in FIG. 4.

FIG. 1 is a block diagram showing, together with a main controller, a basic construction of an embodiment of a memory testing apparatus according to the present invention. Further, in FIG. 1, portions and blocks in FIG. 1 corresponding to those in FIG. 4 have the same reference characters affixed thereto as those in FIG. 4 and the explanation thereof will be omitted unless it is necessary. An exemplary memory testing apparatus includes, similarly to the conventional memory testing apparatus shown in FIG. 4, a pattern generator 10, a waveform producing device 11, a logical comparator 12 and a failure analysis memory 13, and also includes a main controller CP for controlling operations of the memory under test TS.

In the present invention, a failure cell counter 15 is disposed at the rear stage of the failure analysis memory 13. If one or more failure memory cells are detected in a memory under test MUT during one function test, failure data stored in the failure analysis memory 13 are inputted, after the function test is completed, to the failure cell counter 15 to count the number of failure memory cells in a memory under test MUT. The failure cell counter 15 is also connected to the main controller CP and the number of failure memory cells counted is supplied to the main controller CP.

If the number of failure memory cells inputted to the main controller CP this time is equal to the number of failure memory cells inputted to the main controller CP the previous time, the main controller CP controls the operations of the memory testing apparatus TS such that the control operation proceeds to the next function test without performing a memory failure relieving analysis. Further, if the number of failure memory cells inputted to the main controller CP this time is greater than the number of failure memory cells inputted to the main controller CP the previous time, the main controller CP determines that one or more failure memory cells are newly detected and controls the operations of the memory testing apparatus TS such that a failure relieving analysis of the memory under test MUT is performed.

Next, the operations of the main controller CP described above will be explained with reference to the flow charts shown in FIGS. 2 and 3.

Figure 2:
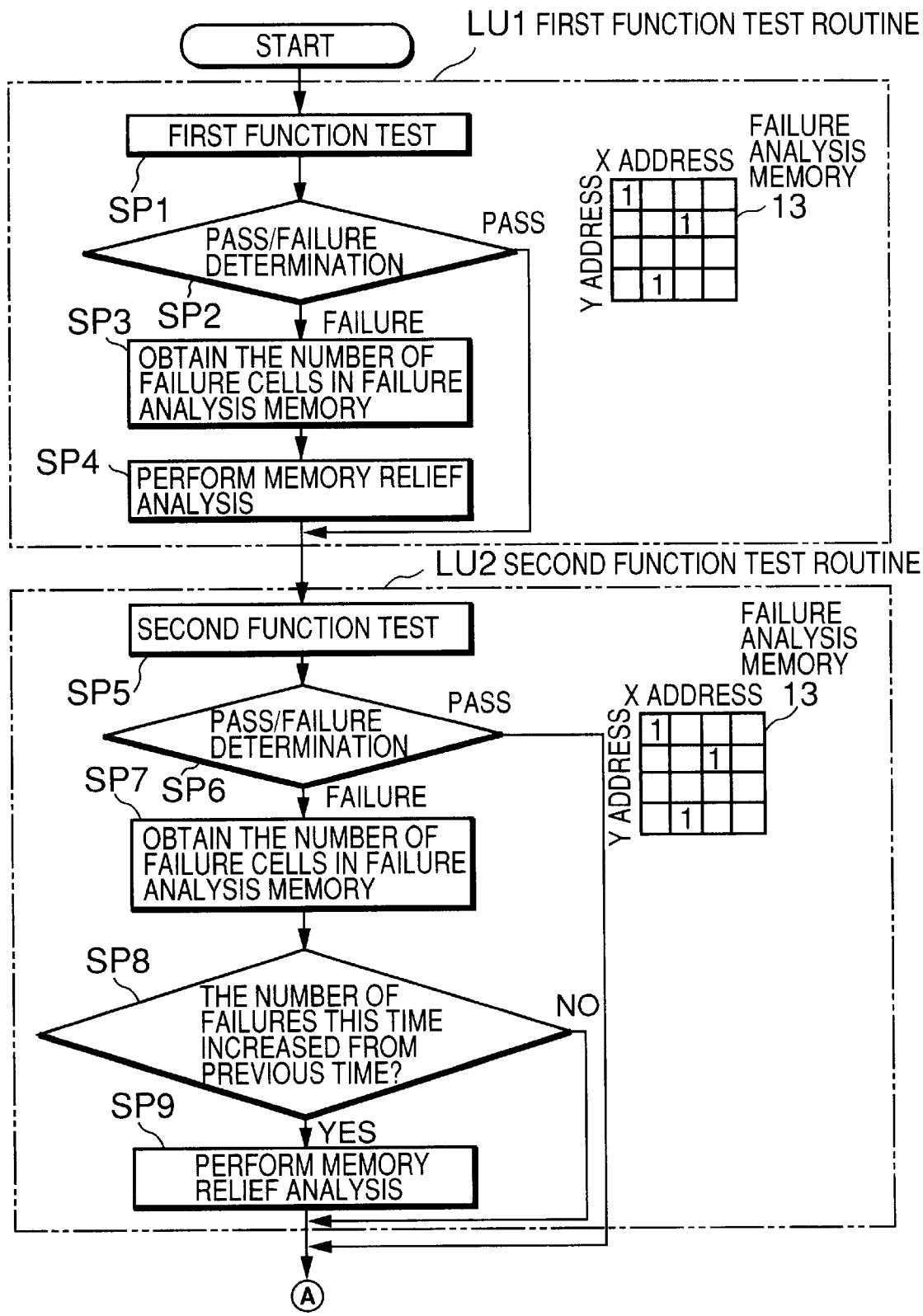
FIG. 2 is a flow chart for explaining the operations of the memory testing apparatus shown in FIG. 1.
Figure 3:
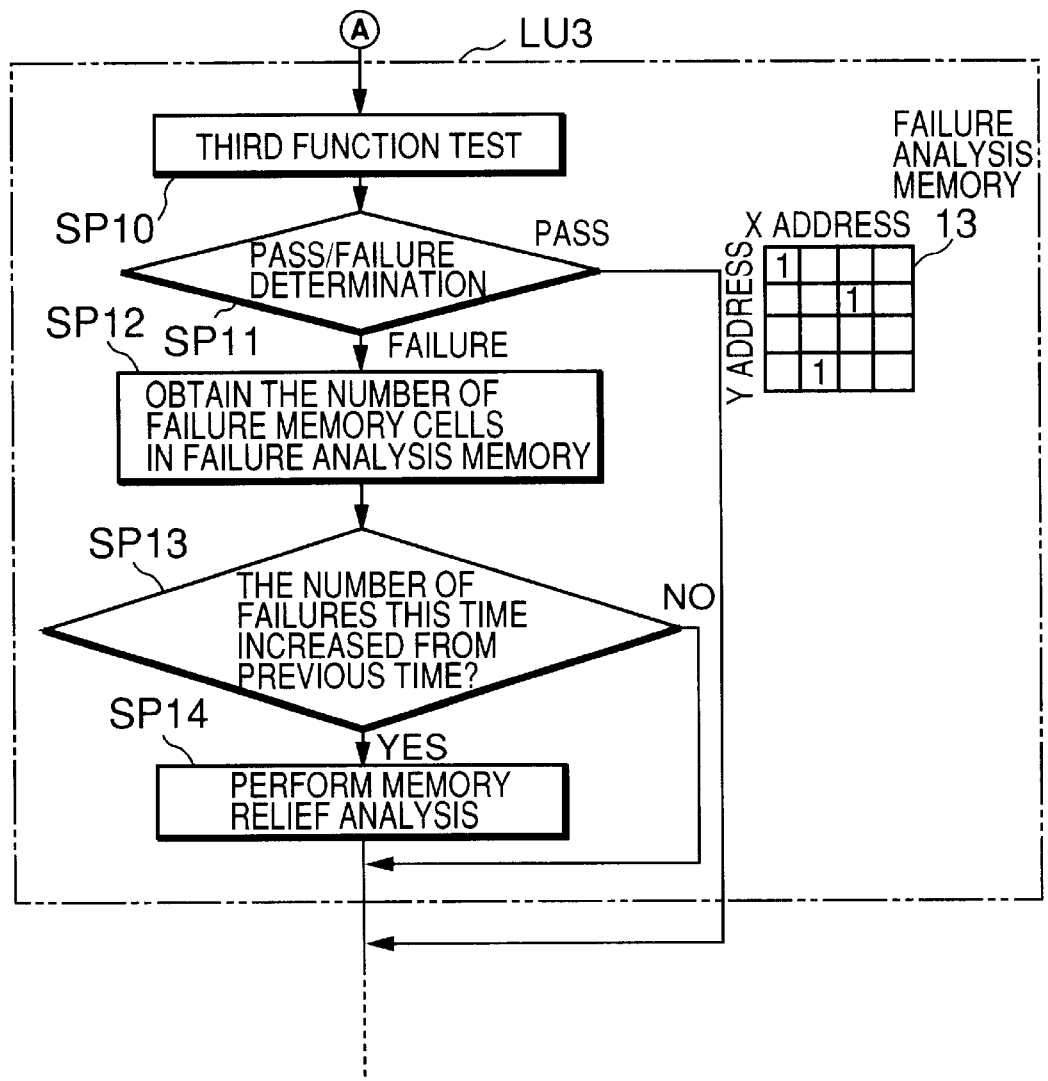
FIG. 3 is a flow chart continued from the flow chart shown in FIG. 2.

FIG. 2 exemplarily shows a first function test routine LU1 and a second function test routine LU2, and storage states of failure memory cell information in the failure analysis memory 13 in those function test routines LU1 and LU2. In addition, FIG. 3 exemplarily shows a third function test routine LU3 and a storage state of failure memory cell information in the failure analysis memory 13 in the function test routine LU3.

First, at the starting time (START) of the first function test of the first function test routine LU1, the storage contents of the failure analysis memory 13 are cleared and all the data stored therein are erased.

Next, the first function test of step SP1 is immediately performed. When a failure signal indicating a discordance is outputted from the logical comparator 12 during this function test, a failure data of, for example, logical "1" indicating a failure memory cell is written in an address of the failure analysis memory 13 which is the same address of the memory under test MUT where the failure memory cell exists. At the same time, the logical comparator 12 outputs a signal for informing the main controller CP of the detection of a failure memory cell so that the main controller CP can recognize that a failure memory cell is detected in the first function test. In the example of FIG. 2, there is shown a case in which three failure memory cells are detected in the memory under test MUT during the first function test.

Further, if, during the first function test of step SP1, no failure memory cell is detected in the memory under test MUT, the memory under test MUT is determined to be pass in the pass/failure determination box of step SP2. Therefore, the control operation immediately proceeds to the next second function test routine LU2.

At the time when the first function test is completed, since the main controller CP has already recognized that one or more failure memory cells exist in the memory under test MUT, the memory under test MUT is determined to be a failure memory in step SP2 and then the control operation proceeds to step SP3.

In this step SP3, the failure cell counter 15 is activated to count the number of failure cells stored in the failure analysis memory 13. That is, the storage contents of the failure analysis memory 13 are read out therefrom and the failure data are inputted to the failure cell counter 15, by which the number of failure cells is counted.

Since a previous function test has not been performed at the time when the first function test is performed, the count value of the failure cell counter 15 is zero (0). Therefore, if failure memory cells are detected during the first function test, the control operation directly proceeds to step SP4 to perform a memory failure relieving analysis based on the count value of the failure cell counter 15.

After the memory failure relieving analysis is performed in step SP4, the control operation proceeds to the second function test routine LU2. In this second function test routine LU2, the second function test of step SP5 is performed in the state that the stored data in the failure analysis memory 13 remain unchanged. Also in this second function test, the memory cells in the memory under test MUT which have been determined to be failure memory cells in the first function test of step SP1 are determined again to be failure memory cells. Therefore, the main controller CP recognizes, also in the second function test, that failure memory cells have been detected in the memory under test MUT. As a result, since the main controller CP determines the memory under test MUT to be a failure memory in step SP6, the control operation proceeds to step SP7.

In step SP7, the failure cell counter 15 is activated to count the number of failure memory cells stored in the failure analysis memory 13. That is, the storage contents in the failure analysis memory 13 are read out therefrom to input the failure data to the failure cell counter 15, by which the number of failure memory cells is counted.

Next, the control operation proceeds to step SP8 in which the number of failure memory cells detected in the previous function test (first function test) is compared with the number of failure memory cells detected in the function test performed this time (second function test). In the example of FIG. 2, there is shown a case in which the number of failure memory cells detected this time is equal to the number of failure memory cells detected in the previous function test. If the number of failure memory cells detected this time is equal to the number of failure memory cells detected in the previous function test, the control operation immediately proceeds to the third function test routine LU3 shown in FIG. 3 without performing the memory failure relieving analysis in step SP9.

Also in this third function test routine LU3, the third function test of step SP10 is performed in the state that the stored data in the failure analysis memory 13 remain unchanged. Also in this third function test, the memory cells in the memory under test MUT which have been determined to be failure memory cells in the first function test of step SP1 are determined again to be failure memory cells. In the example illustrated, there is shown a case in which the same number of failure memory cells as that in the previous function test are detected in the memory under test MUT during the third function test of step SP10. Therefore, the main controller CP recognizes, also in the third function test, that one or more failure memory cells are detected in the memory under test MUT. As a result, since the main controller CP determines the memory under test MUT to be a failure memory in step SP11, the control proceeds to step SP12.

In step SP12, the failure cell counter 15 is activated to count the number of failure memory cells stored in the failure analysis memory 13. That is, the storage contents in the failure analysis memory 13 are read out therefrom to input the failure data to the failure cell counter 15, by which the number of failure memory cells is counted.

Next, the control operation proceeds to step SP13 in which the number of failure memory cells detected in the previous function test (second function test) is compared with the number of failure memory cells detected in the function test performed this time (third function test). In the example of FIG. 3, since the number of failure memory cells detected this time is equal to the number of failure memory cells detected in the previous function test, the control operation immediately proceeds to a function test routine of the next stage (not shown) without performing the memory failure relieving analysis in step SP14.

The above control operations are continued until the predetermined number of function test routines are completed. After all the function test routines are completed, the final decision as to whether or not the memory under test is a failure memory is made.

As explained above, in the present invention, upon the completion of each function test, the number of failure memory cells stored in the failure analysis memory 13 is counted if one or more failure memory cells are detected in a memory under test MUT. If the count value is equal to the number of failure memory cells detected in the previous function test, it is determined that there is no necessity of the memory failure relieving analysis, and hence the memory failure relieving analysis is not performed. Only when the number of failure memory cells detected in the function test performed this time is increased, it is determined that one or more new failure memory cells are detected, and hence the memory failure relieving analysis is performed. Since the memory testing apparatus according to the present invention is constructed in such a manner as described above, it is sufficient to provide counting means which can count the number of failure memory cells upon completion of each function test. Therefore, since there is no necessity for use of a mask memory as in the prior art shown in FIG. 4, there is obtained a remarkable advantage that the memory testing apparatus can be provided cheaply.

Further, in the embodiment described above, if no failure memory cell is detected in the memory under test MUT during the execution of the first function test of step SP1 of the first function test routine LU1, as mentioned above, the second function test step SP5 of the second function test routine LU2 is immediately performed. In this case, although the count value of the failure cell counter 15 is zero (0) just after the first function test is performed, when one or more failure memory cells are detected in the memory under test MUT, the determination in step SP6 becomes "failure". As a result, the next steps SP7, SP8 and SP9 are performed, and thus the failure relieving analysis of the memory under test MUT is performed based on the count value of the failure cell counter 15.

In the above embodiment, although the number of memories under test MUT is not especially mentioned, the memory testing apparatus is generally constructed such that a plurality of memories can be tested at the same time. Therefore, it could be easily understood that the present invention can be applied to a memory testing apparatus for testing a plurality of memories at the same time. In this case, the memory testing apparatus is constructed such that the failure cell counter 15 is provided therein for each of the memories under test to count the number of failure memory cells and the determination as to whether or not the failure relieving analysis of each of the memories under test is necessary is made.

Further, a function for counting the number of failure memory cells may be provided in the failure analysis memory 13 instead of individually providing a failure cell counter 15 for each memory under test MUT.

What is claimed is:

1. A memory testing apparatus comprising:

means for continuously carrying out a plurality of function tests for a semiconductor memory to be tested, for storing information of a failure memory cell or cells detected in the semiconductor memory in a failure analysis memory upon completion of each function test, and for rendering a decision as to whether or not the semiconductor memory can be relieved depending upon the number of failure memory cells stored in said failure analysis memory, and means for comparing, after one of said function tests is performed, the number of failure memory cells of a memory under test detected in the preceding function test with the number of failure memory cells of the memory under test detected in a function test performed this time, and performing a failure relieving analysis of the memory under test only when the number of failure memory cells detected this time is greater than the number of failure memory cells detected in the preceding function test.

2. The memory testing apparatus according to claim 1 wherein said memory testing apparatus includes a pattern generator, a waveform producing device, a logical comparator, a failure analysis memory and a main controller for controlling operations of said memory testing apparatus;

said pattern generator generates, under control of said main controller, a test pattern data signal and supplies the test pattern data signal to said waveform producing device;

said waveform producing device generates, based on a signal supplied thereto from said pattern generator, a test pattern signal having a waveform required for a semiconductor memory test and applies the test pattern signal to said semiconductor memory;

said logical comparator compares a signal read out from said semiconductor memory with an expected value data signal supplied to said logical comparator from said pattern generator under control of said main controller, and judges, when there is a discordance between the both signals, that said semiconductor memory has a failure memory cell and supplies a failure signal indicating a failure of a memory cell to said failure analysis memory, and at the same time, informs said main controller of an occurrence of a failure memory cell; and said failure analysis memory stores therein said failure signal indicating a failure of a memory cell or a failure data corresponding to said failure signal, and at the same time, supplies the number of failure data stored therein to said main controller.

3. The memory testing apparatus according to claim 1 wherein said memory testing apparatus includes a pattern generator, a waveform producing device, a logical comparator, a failure analysis memory, a failure cell counter and a main controller for controlling operations of said memory testing apparatus;

said pattern generator, said logical comparator and said failure cell counter are also connected to said main controller;

said pattern generator generates, under control of said main controller, a test pattern data signal and supplies the test pattern data signal to said waveform producing device;

said waveform producing device generates, based on a signal supplied thereto from said pattern generator, a test pattern signal having a waveform required for a semiconductor memory test and applies the test pattern signal to said semiconductor memory;

said logical comparator compares a signal read out from said semiconductor memory with an expected value data signal supplied to said logical comparator from said pattern generator under control of said main controller, and judges, when there is a discordance between the both signals, that said semiconductor memory has a failure memory cell and supplies a failure signal indicating a failure of a memory cell to said failure analysis memory, and at the same time, informs said main controller of an occurrence of a failure memory cell;

said failure analysis memory stores therein said failure signal indicating a failure of a memory cell or a failure data corresponding to said failure signal; and said failure cell counter counts the number of failure data stored in said failure analysis memory and supplies the number of failure data to said main controller.

4. The memory testing apparatus according to claim 2 or 3 wherein said main controller controls, in each of said function tests, said memory testing apparatus such that:

when no failure memory cell is detected in said semiconductor memory to be tested, a control operation is immediately advanced to a next function test;

when one or more failure memory cells are detected in said semiconductor memory to be tested, the number of failure memory cells stored in said failure analysis memory is counted after a current function test is completed; and in each of subsequent function test routines except for the first function test routine, the count value of the failure memory cells is compared with the count value of the failure memory cells counted after completion of the preceding function test, when the count value counted this time is equal to or smaller than the preceding count value, the control operation is advanced to a next function test routine, and when the count value counted this time is greater than the preceding count value, the control operation is advanced to a next function test routine after performing a failure relieving analysis of said semiconductor memory to be tested.

5. In a memory testing apparatus wherein a plurality of function tests are continuously carried out for a semiconductor memory to be tested, information of a failure memory cell or cells detected in the semiconductor memory is stored in a failure analysis memory upon completion of each function test, and a decision as to whether or not said semiconductor memory can be relieved is rendered depending upon the number of failure memory cells stored in said failure analysis memory, a method for testing a memory comprising the steps of:

comparing, after one of said function tests is performed, the number of failure memory cells of a memory under test detected in the preceding function test with the number of failure memory cells of the memory under test detected in a function test performed this time; and performing a failure relieving analysis of the memory under test only when the number of failure memory cells detected this time is greater than the number of failure memory cells detected in the preceding function test.

6. The method for testing a memory according to claim 5, further comprising the steps of:

immediately advancing a control operation to a next function test routine when no failure memory cell is detected in said semiconductor memory to be tested in each of said function tests; and counting the number of failure memory cells stored in said failure analysis memory after a current function test is completed when one or more failure memory cells are detected in said semiconductor memory to be tested; and wherein said comparing step is a step wherein in each of subsequent function test routines except for the first function test routine, the number of failure memory cells detected this time is compared with the number of failure memory cells detected in the preceding function test, when the number of failure memory cells detected this time is equal to or smaller than the number of failure memory cells detected in the preceding function test, the control operation is advanced to a next function test routine, and when the number of failure memory cells detected this time is greater than the number of failure memory cells detected in the preceding function test, the control operation is advanced to a step for performing a failure relieving analysis of said semiconductor memory to be tested.

* * * * *